United States Patent
Baba (10) Patent No.: US 7,192,242 B2
(45) Date of Patent: Mar. 20, 2007

(54) WORK ATTRACTING APPARATUS AND WORK ATTRACTING METHOD

(75) Inventor: Hiroyuki Baba, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/809,683

(22) Filed: Mar. 26, 2004

(65) Prior Publication Data

US 2004/0187280 A1 Sep. 30, 2004

(30) Foreign Application Priority Data

Mar. 27, 2003 (JP) .............................. 2003-087111

(51) Int. Cl.
*B65G 37/00* (2006.01)

(52) U.S. Cl. .............. 414/749; 198/341.05; 198/464.2; 198/468.4; 414/416.06

(58) Field of Classification Search ................ 414/749, 414/811, 416.05, 416.06, 416.09, 941; 198/468.4, 198/464.2, 464.3, 341.05, 468.8; 294/64.3; 221/211

See application file for complete search history.

(56) References Cited

U.S. PATENT DOCUMENTS

| | | | |
|---|---|---|---|
| 2,783,869 A * | 3/1957 | Thurman | ........... 414/416.06 X |
| 4,566,726 A | 1/1986 | Correnti et al. | |
| 6,189,674 B1* | 2/2001 | Izumida et al. | ........ 198/341.01 |
| 6,190,115 B1* | 2/2001 | Suzuki et al. | ............ 414/752.1 |
| 6,341,769 B1 | 1/2002 | Lin et al. | |
| 2002/0130524 A1* | 9/2002 | McIlwraith et al. | ........ 294/64.3 |

FOREIGN PATENT DOCUMENTS

| | | |
|---|---|---|
| JP | 51-37575 | 3/1976 |
| JP | 9-237818 | 9/1997 |

\* cited by examiner

*Primary Examiner*—Donald Underwood
(74) *Attorney, Agent, or Firm*—Rabin & Berdo, PC (57) ABSTRACT

A work attracting apparatus and a work attracting method that uses a Bernoulli chuck or the like as a work attraction section and that can ensure the perfect operation of attracting and receiving. The work attraction section (Bernoulli plate 1 and Bernoulli arm 2) attracts a wafer 14 being transported in; a movement section (moving unit 3 and speed variable actuator 10) moves the work attraction section in a direction of transport of the wafer 14; a work detector 4 detects the wafer 14 being transported at a predetermined position and outputs a detection signal; and a controller 5, when receiving the detection signal, controls the movement section to move together with the wafer 14 being transported and makes the work attraction section operate.

11 Claims, 6 Drawing Sheets

WORK ATTRACTING APPARATUS AND WORK ATTRACTING METHOD

BACKGROUND OF THE INVENTION

1. Field of the Invention

The present invention relates to a work attracting apparatus and a work attracting method used in the process of manufacturing semiconductor devices and the like.

2. Description of the Related Art

In the process of manufacturing semiconductor devices and the like, trays stream consecutively like in a belt-conveyor. Wafers are mounted on the trays. In each process, wafers are received from trays streaming consecutively. A processing assigned to each process is performed on the wafers, and the wafers are returned onto trays and sent out to another of the processes. A work attracting apparatus performs receiving and sending out wafers in each process. In particular, it is required that wafers be received and sent out in a non-contact manner in the process of manufacturing semiconductor devices and the like. Hence, performing such operation precisely and in a short time is one of the most difficult manufacturing technologies.

For example, for a conventional work attracting apparatus used for a normal-pressure CVD apparatus and the like in the semiconductor manufacturing process, wafers processed in the previous processes stream thereto consecutively. When a wafer arrives at a predetermined position, a Bernoulli chuck following the Bernoulli principle moves down to the wafer, attracts the wafer, and takes into its own process. The permissible time from when a wafer arrives at a predetermined position to when a Bernoulli chuck moves down to and attracts the wafer was about 4 seconds.

The Bernoulli chuck following the Bernoulli principle refers to a arm-shaped chuck that ejects gas (usually nitrogen gas) through a nozzle in the center of the attraction plate to have high speed gas flow along the surface of a wafer and thereby generates negative pressure to hold the wafer on the attraction plate in a non-contact manner. An example of the technology for using the Bernoulli chuck in the semiconductor manufacturing process is disclosed in, for example, Japanese Patent Laid-Open Publication No. 51-37573 (pp. 1–3, FIG. 1).

Furthermore, a technology is disclosed in, for example, Japanese Patent Laid-Open Publication No. 9-237818 (Abstract), with which a wafer transfer apparatus (equivalent to the work attracting apparatus of the present invention) mounts a work onto the receiving portion with restricting an impulse given to the work to as little as possible so that the work transfer apparatus operates precisely, while keeping a transport mechanism transporting works at high speed.

In the above prior art, the permissible time from when a wafer arrives at a predetermined position to when a Bernoulli chuck moves down to the wafer and attracts the wafer is as short as about 4 seconds, and hence it is difficult to perform precise attraction operation by the Bernoulli chuck.

Meanwhile, it is hard to adopt lengthening the permissible time for attraction because it would lower the efficiency in manufacturing semiconductor products. Moreover, in the process of manufacturing semiconductor devices and the like, where it is required that wafers be received and sent out in a non-contact manner, it is hard to adopt chucks other than the Bernoulli chuck in terms of performing attraction operation certainly.

SUMMARY OF THE INVENTION

The object of the present invention is to solve the above problem and realize a work attracting apparatus and a work attracting method with the configuration including the Bernoulli chuck that can certainly perform wafer attraction in a short time.

The present invention adopts the following configurations in order to solve the problem.

According to the present invention, there is provided a work attracting apparatus comprising:

a work attraction section for attracting a work being transported;

a movement section that moves the work attraction section along a transportation direction of the work;

a work detector that detects the work being transported at a predetermined position and outputs a detection signal; and a controller that, when receiving the detection signal, controls the movement section to move together with the work being transported and makes the work attraction section operate.

In the work attracting apparatus, the work attraction section may be a Bernoulli chuck.

According to the present invention, further, there is provided a work attracting apparatus comprising:

a work attraction section for attracting a work being transported;

a work detector that detects the work being transported at a predetermined position and outputs a detection signal;

a work pushing-up portion that applies pressure to predetermined part of the work to displace the work in a predetermined amount in a attraction direction; and a controller that, when receiving the detection signal, makes the work pushing-up portion operate to displace the work in the predetermined amount in the attraction direction.

In the work attracting apparatus, the work attraction section also may be a Bernoulli chuck.

According to the present invention, moreover, there is provided a work attraction method, comprising:

making a work attraction section stand by at a predetermined position for attracting a work being transported;

detecting the work being transported which arrived at the predetermined position;

moving the work attraction section at a same speed as transporting speed of the work along transportation direction of the work for a predetermined time, for making the work attraction section attracting the work during the predetermined time.

In the work attraction method, the work attraction section attracts the work by using negative pressure based on the Bernoulli principle.

According to the present invention, furthermore, there is provided a work attraction method, comprising:

making a work attraction section stand by at a predetermined position for attracting a work being transported;

detecting the work being transported which arrived at the predetermined position;

pressuring toward the predetermined position of the work and displacing the work toward a attraction direction, in a predetermined amount, for accelerating the attraction of the work.

In the work attraction method, the work attraction section attracts the work by using negative pressure based on the Bernoulli principle.

The above and other objects and features of the present invention will become apparent from the following detailed description and the appended claims with reference to the accompanying drawings.

DETAILED DESCRIPTION OF THE PREFERRED EMBODIMENT

Embodiments of the present invention will be described below using specific examples.

CONFIGURATION OF SPECIFIC EXAMPLE 1

In the present specific example, in order to allow a time for a work attraction section to attract a work to be long, the work attraction section is made to move in the direction of work transport at the same speed as the work is transported for a predetermined time. In order to achieve such operation, the present specific example is configured as follows, where the work attraction section refers to a part of a work attracting apparatus moving together with a work.

FIG. 1 is a view of the configuration of specific example 1.

(a) is a plan view, (b) is a front view, (c) is a right side view, and (d) is an enlarged view of a C portion.

As seen from the drawing, the work attracting apparatus of specific example 1 comprises Bernoulli plates 1, a Bernoulli arm 2, a moving unit 3, a work detector 4, a controller 5, a support plate 6, a guide shaft 7, a guide shaft support (1) 8, a guide shaft support (2) 9, and a speed variable actuator 10. In the description below, the case is taken as an example where works to be handled by the work attracting apparatus are (semiconductor) wafers.

The Bernoulli plate 1 is an attraction plate that ejects gas at high speed along the surface of a wafer and thereby generates negative pressure to hold the wafer thereon in a non-contact manner.

The Bernoulli arm 2 is an arm that moves the Bernoulli plate 1 to a desired position and that also takes in a predetermined gas (usually nitrogen gas) from the outside of the apparatus through a gas introducing portion 11 provided therein to supply the gas for high speed ejection to the Bernoulli plate 1.

The Bernoulli plates 1 and the Bernoulli arm 2 form a Bernoulli chuck.

Here, the outline of the Bernoulli chuck will be described (details are set forth in Japanese Patent Laid-Open Publication No. 51-37573). The Bernoulli chuck is a chuck that supports a wafer in a non-contact manner by using the Bernoulli principle that when ejecting, for example, nitrogen gas through an ejection hole (not shown) in the center of the Bernoulli plate 1 into between the upper surface of the wafer (a face opposite the Bernoulli plate 1) and the lower surface of the Bernoulli plate 1 (a face opposite the wafer), the gas flows at high speed toward the periphery of the Bernoulli plate 1, and thus negative pressure is generated in the space surrounded by the upper surface of the wafer and the lower surface of the Bernoulli plate 1.

The moving unit 3, supporting the base of the Bernoulli arm 2, receives a driving force in a Y axial direction in the drawing from the speed variable actuator 10 to move in the Y axial direction in the drawing integrally with the Bernoulli chuck. Also, the moving unit 3 moves the Bernoulli chuck in a Z axial direction in the drawing. This mechanism will be described in detail with reference to another drawing.

Figure 2:
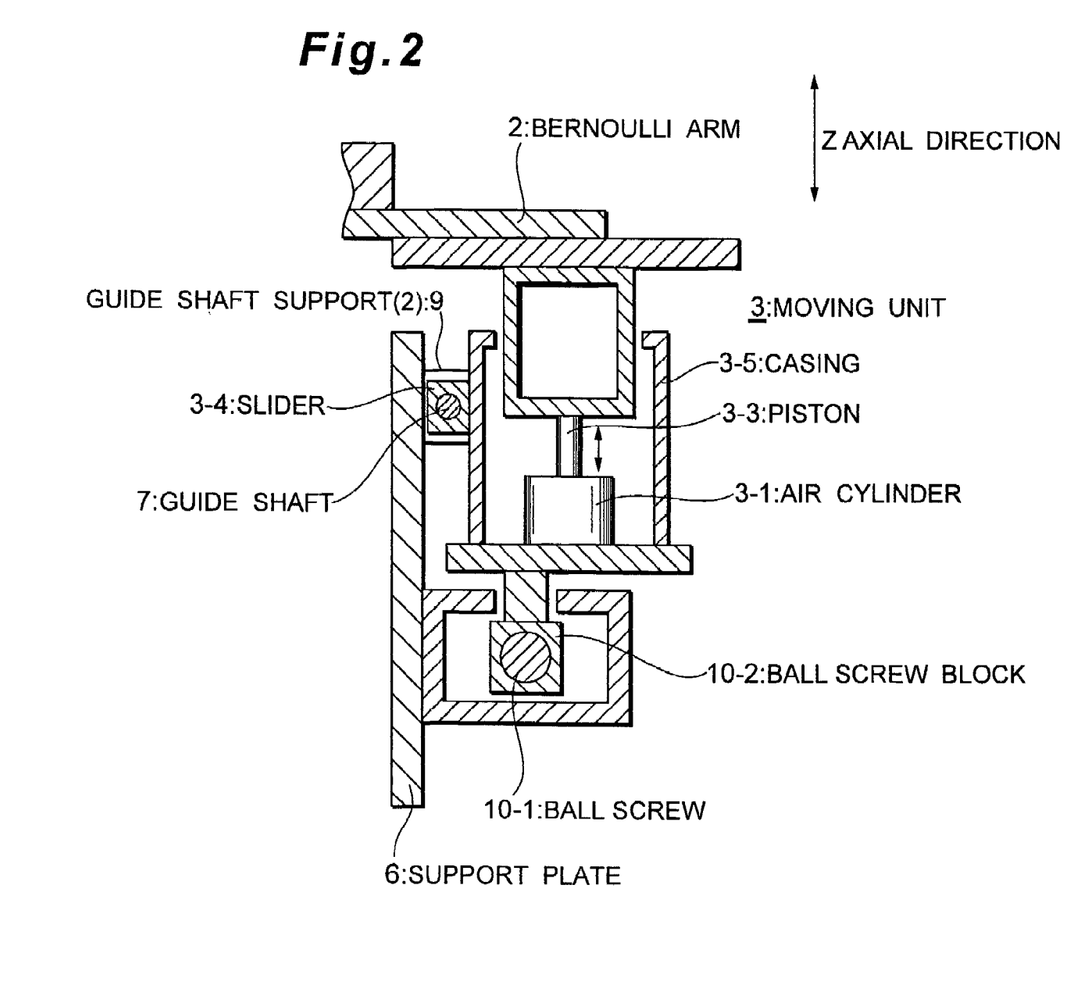
FIG. 2 is an enlarged cross-sectional view on arrow A—A.

FIG. 2 is an enlarged cross-sectional view on arrow A—A.

The figure is an enlarged view of the cross-section on arrow A—A in FIG. 1. The same constituents as in FIG. 1 are denoted by the same reference numerals.

As shown in the figure, a casing 3-5 of the moving unit 3 is fixed on a ball screw block 10-2 forming part of the speed variable actuator 10 (FIG. 1), and the moving unit 3 receives a driving force in the Y axial direction (FIG. 1) via a ball screw 10-1 forming part of the speed variable actuator 10 (FIG. 1).

The moving unit 3 receiving the driving force in the Y axial direction (FIG. 1) has a slider 3-4 fixed to the outside wall of the casing 3-5 and moves in the Y axial direction (FIG. 1) with being guided by a guide shaft 7 via the slider. The guide shaft 7 is fixed to the support plate 6 via the guide shaft support (1) 8 (FIG. 1) and the guide shaft support (2) 9. Note that the support plate 6 is fixed to a non-movable portion of the semiconductor manufacturing apparatus.

Next, the configuration of the Bernoulli chuck movable in the Z axial direction will be described.

As shown in FIG. 2, the moving unit 3 has an air cylinder 3-1 incorporated in the casing 3-5. The air cylinder 3-1 extends and retracts a piston 3-3 in the Z axial direction under the control of the controller 5 (FIG. 1). The piston 3-3 extending and retracting in the Z axial direction causes the Bernoulli arm 2 fixed to the piston 3-3 to move in the Z axial direction.

Referring back to FIG. 1, the work detector 4 is a sensor for monitoring the position of wafers. Specifically, when wafers being transported from the preceding process arrive at a predetermined position, the work detector 4 detects the arrival of the wafers and notifies to the controller. The work detector 4 is usually a photo-sensor or the like and usually fixed to a non-movable portion of the semiconductor manufacturing apparatus.

The controller 5 is constituted by a CPU (Central Processing Unit) controlling the operation of the Bernoulli chuck. The controller 5 waits for the arrival of wafers being transported from the preceding process, having the Bernoulli chuck consisting of the Bernoulli plates 1 and the Bernoulli arm 2 stand by at a predetermined position. When the work detector 4 detects wafers arriving at a predetermined position, the controller 5 controls the speed variable actuator 10 to move the Bernoulli chuck in the wafer transport direction for a predetermined time at the same speed as the wafers are being transported, in order to secure enough time for the Bernoulli chuck to attract and receive the wafers.

Within the predetermined time, the Bernoulli chuck attracts the wafers. As a result, while in the above prior art the permissible time for the Bernoulli chuck moving down to a wafer and attracting the wafer is about 4 seconds, in the present specific example, it is possible to lengthen it to 10 seconds or longer.

The support plate 6 is fixed to a non-movable portion of the semiconductor manufacturing apparatus and supports the wafer transfer apparatus of the present specific example.

The guide shaft 7 guides the movement of the Bernoulli chuck in the Y axial direction.

The guide shaft support (1) 8 and the guide shaft support (2) 9 are for fixing the guide shaft 7 to the support plate 6.

The speed variable actuator 10 comprises the ball screw 10-1 (FIG. 2) having the ball screw block 10-2 screwed therein and a precise drive control motor (not shown) for rotationally driving the ball screw 10-1, and makes the moving unit 3 (the Bernoulli chuck) move in the Y axial direction at variable speed as above by driving the ball screw 10-1 (FIG. 2). The ball screw 10-1 (FIG. 2) is rotatably supported on the support plate 6.

The gas introducing portions 11 provided in the Bernoulli arm 2 are in communication with an external gas supplier (not shown) and take in a predetermined gas (for example, nitrogen gas) from this supplier to supply it as gas for high speed ejection to the Bernoulli plates 1.

Figures 1A, 1B, 1C, 1D:
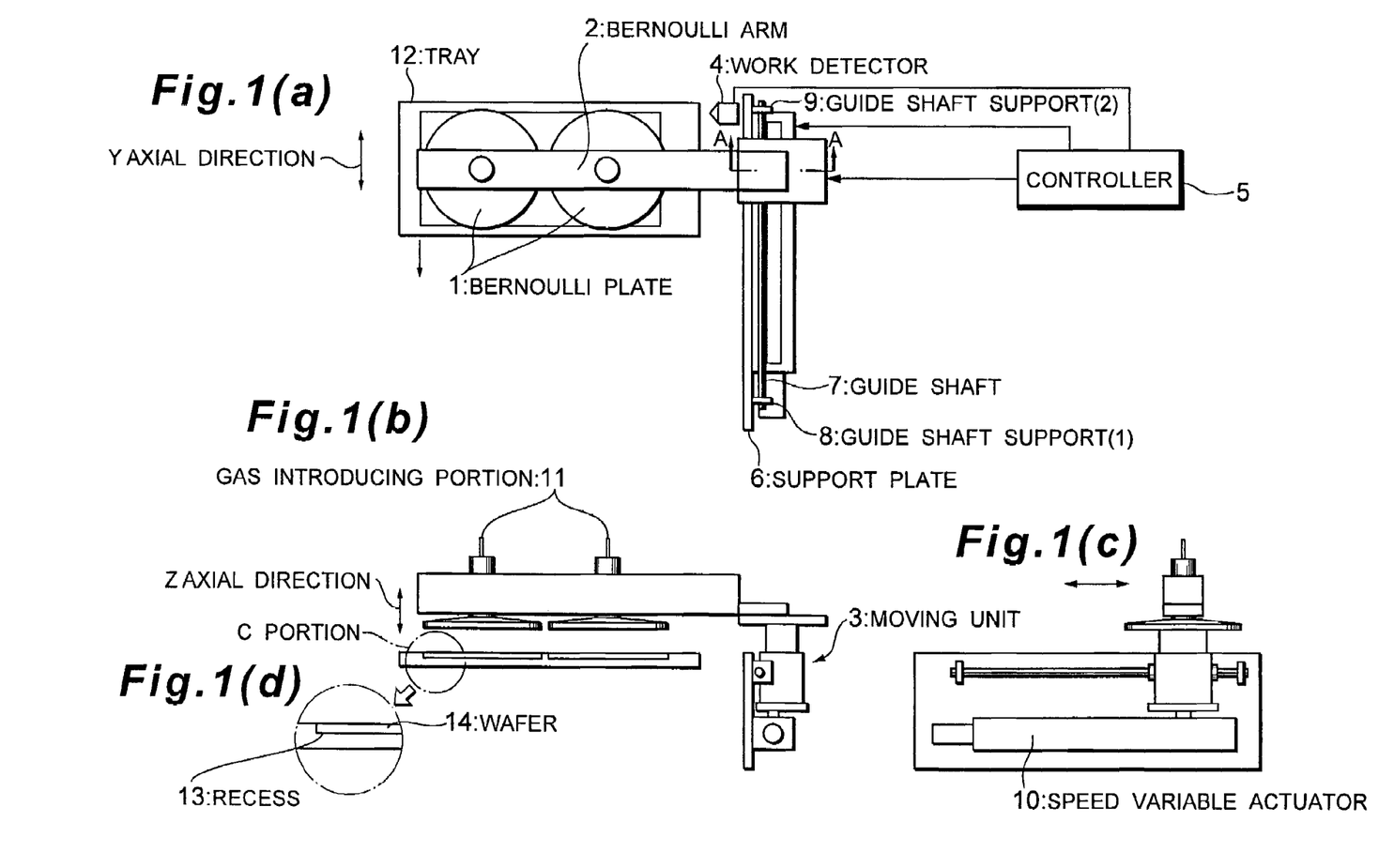
FIG. 1 is a view of the configuration of specific example 1.

Note that trays 12 are wafer transport sections moving with wafers mounted thereon between the processes in the semiconductor manufacturing process. The trays 12 are provided with recesses 13 (FIG. 1*d*) each matching the shape of a wafer 14 so as to prevent the displacement of the wafer 14 during movement.

OPERATION OF SPECIFIC EXAMPLE 1

Figures 3A, 3D:
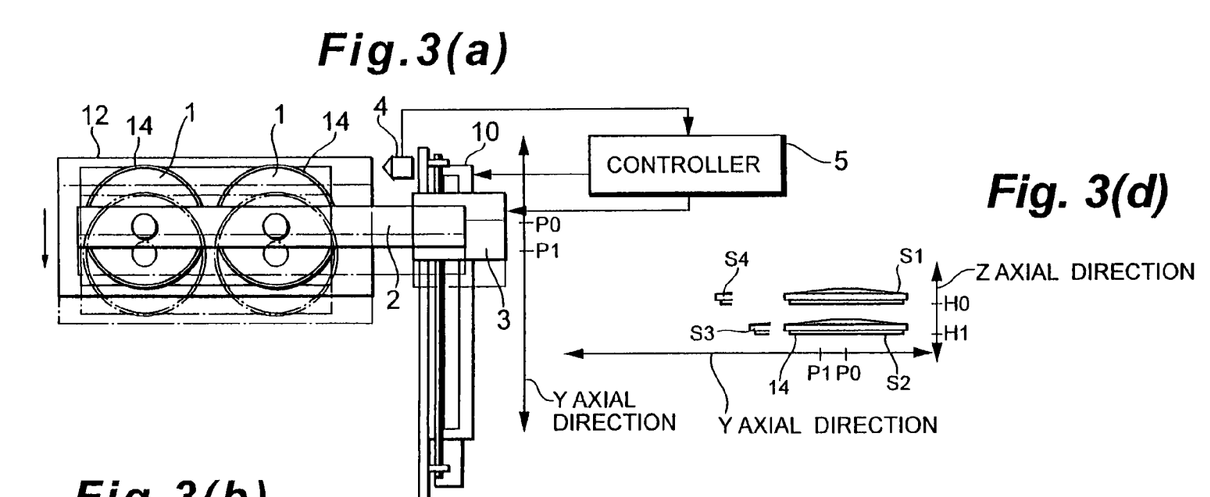
FIG. 3 is a view for explaining the operation of specific example 1.
Figure 3B:
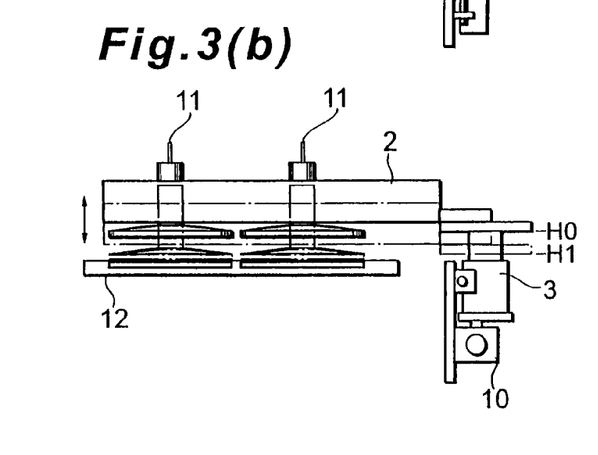
Figure 3C:
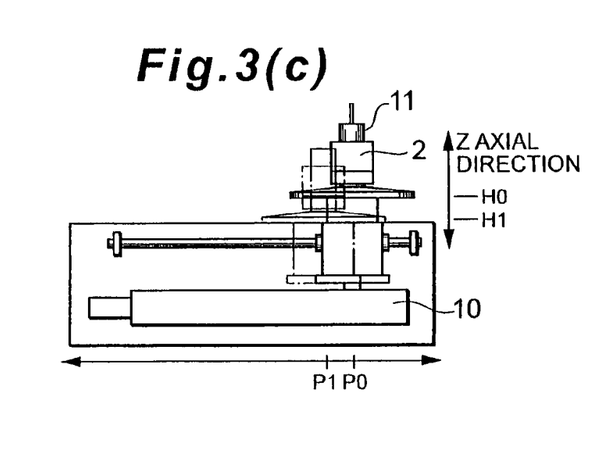

FIG. 3 is a view for explaining the operation of specific example 1.

(a) is a plan view, (b) is a front view, (c) is a right side view, and (d) is a right side imaginary view representing the position change of only the Bernoulli plates.

The operation of specific example 1 is divided into four steps, and these steps will be explained below.

<Step S1>

The controller 5 waits for the arrival of wafers 14 being transported by a tray 12 from the preceding process, having the Bernoulli chuck consisting of the Bernoulli plate 1 and the Bernoulli arm 2 stand by at a predetermined position.

Here, the predetermined position is designated by P0 on the Y-axis and H0 on the Z-axis, and the Bernoulli plate 1 is indicated by S1 in FIG. 3*d*.

<Step S2>

The work detector 4 detects wafers 14 on a tray 12 approaching a predetermined position (P0 on the Y-axis) and notifies the controller 5. The controller 5 controls the air cylinder 3-1 of the moving unit 3 (FIG. 2) to lower the Bernoulli arm 2 together with the Bernoulli plates 1, and has the Bernoulli plates 1 arrive at a position H1 on Z-axis when the wafers 14 arrived at their predetermined position (P0 on the Y-axis). At this time, the controller 5 introduces nitrogen gas from the gas introducing portions 11 and starts to attract the wafers 14, and simultaneously controls the speed variable actuator 10 to start moving the Bernoulli arm 2 together with the Bernoulli plates 1 in the same direction as the tray 12 is transported and at the same speed as the transport speed. The Bernoulli plates 1 are indicated by S2 in FIG. 3*d*.

<Step S3>

After the controller 5 starts holding the wafers by attraction while moving the Bernoulli arm 2 together with the Bernoulli plates 1 in the same direction as the tray 12 is transported and at the same speed as the transport speed for a predetermined time (for example, about 10 seconds), the controller 5 controls the air cylinder 3-1 of the moving unit 3 (FIG. 2) to start raising the Bernoulli arm 2 together with the Bernoulli plates 1 with the wafers 14 attracted thereon. The Bernoulli plates 1 are indicated by S3 in FIG. 3*d*.

<Step S4>

When the Bernoulli plates 1 with the wafers 14 attracted thereon return to H0 in the Z axial direction, the controller 5 completes the operation of attracting and receiving the wafers from the preceding process, and starts performing the operation for its own process. The Bernoulli plates 1 are indicated by S4 in FIG. 3*d*.

Although the above description has been made taking as an example the case where works being handled by the work attracting apparatus are (semiconductor) wafers, the present invention, not being limited to this example, can be applied to, for example, glass plates in a liquid crystal manufacturing process and the like.

Furthermore, although in the above the case has been described where the Bernoulli arm 2 is movable only in the Y and Z axial directions, the present invention, not being limited to this example, can be applied to, for example, the case where the Bernoulli arm 2 also performs predetermined rotation.

Note that, for the present specific example, the work attraction section refers to a mechanism including the Bernoulli plate 1 and the Bernoulli arm 2, and that, for the present specific example, the movement section refers to a mechanism including the moving unit 3 and the speed variable actuator 10.

EFFECT OF SPECIFIC EXAMPLE 1

As described above, in the present specific example, the controller has the work attraction section stand by at a predetermined position, waiting for the arrival of wafers being transported from the preceding process, and when the work detector detects the wafers having arrived at a predetermined position, the work attraction section moves in the direction in which the wafers are transported and at the same speed as the wafer transport speed for a predetermined time so as to lengthen the permissible time for attracting and receiving the wafers. By this means, even when the Bernoulli chuck or the like having the problem in attracting and receiving is adopted in the work attraction section, the perfect operation of attracting and receiving can be ensured.

CONFIGURATION OF SPECIFIC EXAMPLE 2

In the present specific example, in a model whose work attraction section cannot, or hardly, move in the direction in which works are transported and at the same speed as the work transport speed for a predetermined time as in the above specific example 1, pressure is applied to predetermined positions of the works to separate the works from the tray to accelerate the operation of attracting and receiving, for the purpose of performing perfect attracting operation. In order to achieve the objective, the present specific example is configured as follows.

Figures 4A, 4B, 4C:
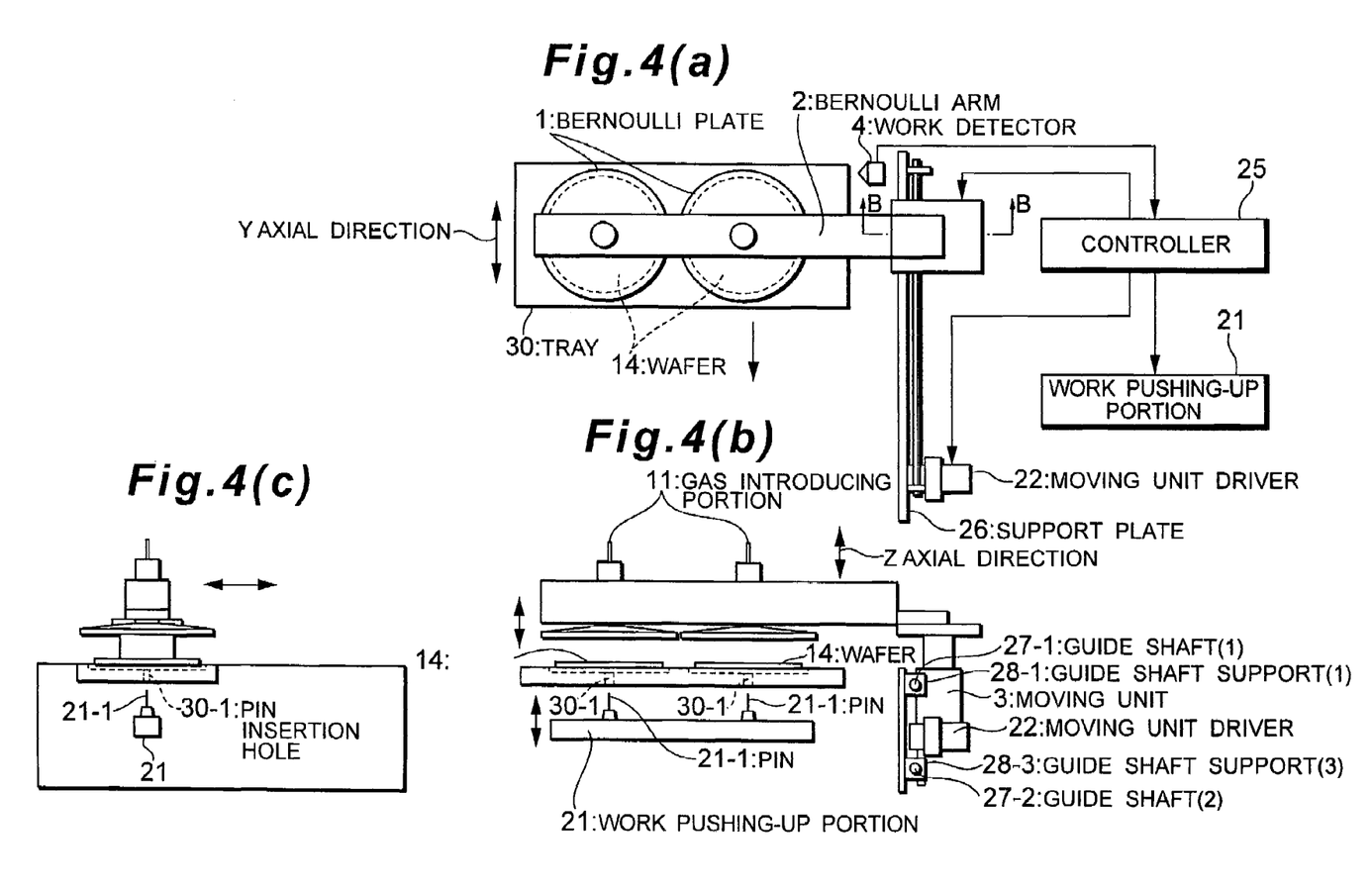
FIG. 4 is a view of the configuration of specific example 2.

FIG. 4 is a view of the configuration of specific example 2.

(a) is a plan view, (b) is a front view, and (c) is a left side view.

As seen from the drawing, the work attracting apparatus of specific example 2 comprises Bernoulli plates 1, a Bernoulli arm 2, a moving unit 3, a work detector 4, a work pushing-up portion 21, a moving unit driver 22, a controller 25, a support plate 26, a guide shaft (1) 27-1, a guide shaft (2) 27-2, a guide shaft support (1) 28-1, a guide shaft support (2) 28-2, a guide shaft support (3) 28-3, and a guide shaft support (4) 28-4. In the description below, the case is taken as an example where works to be handled by the work attracting apparatus are (semiconductor) wafers.

The work pushing-up portion 21, under the control of the controller 25, applies pressure to predetermined positions of wafers 14 by a drive mechanism (not shown) to displace the works by a predetermined amount in an attraction direction and thereby separates the works from the tray to accelerate the operation of the Bernoulli chuck attracting and receiving. The predetermined positions are, for example, the centers of the wafers 14. In order to achieve this objective, the work pushing-up portion 21 has pins 21-1 attached thereto. Moreover, a tray 30 is provided with pin insertion holes 30-1 through which the pins 21-1 can be inserted to apply pressure to the centers of the wafers 14.

The moving unit driver 22 generates a drive force for moving the Bernoulli chuck in a Y axial direction. Details of the configuration will be described with reference to other drawings.

Figure 5:
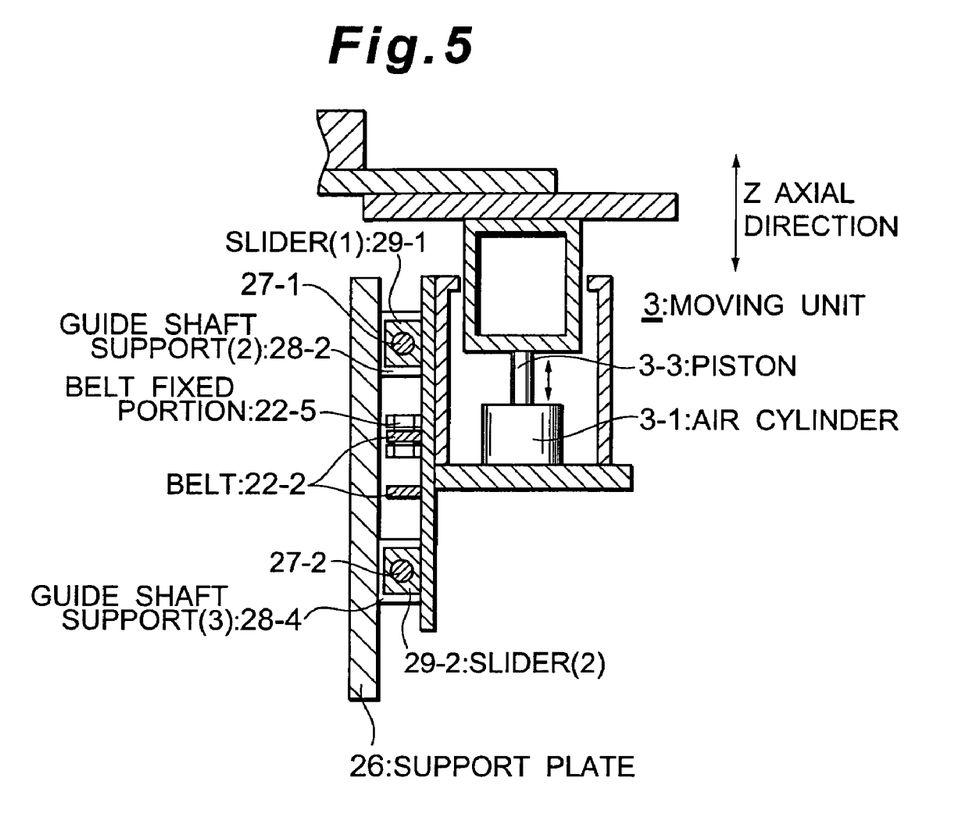
FIG. 5 is an enlarged cross-sectional view on arrow B—B.

FIG. 5 is an enlarged cross-sectional view on arrow B—B.

The figure is an enlarged view of the cross-section on arrow B—B in FIG. 4. The same constituents as in FIG. 4 are denoted by the same reference numerals.

Figure 6:
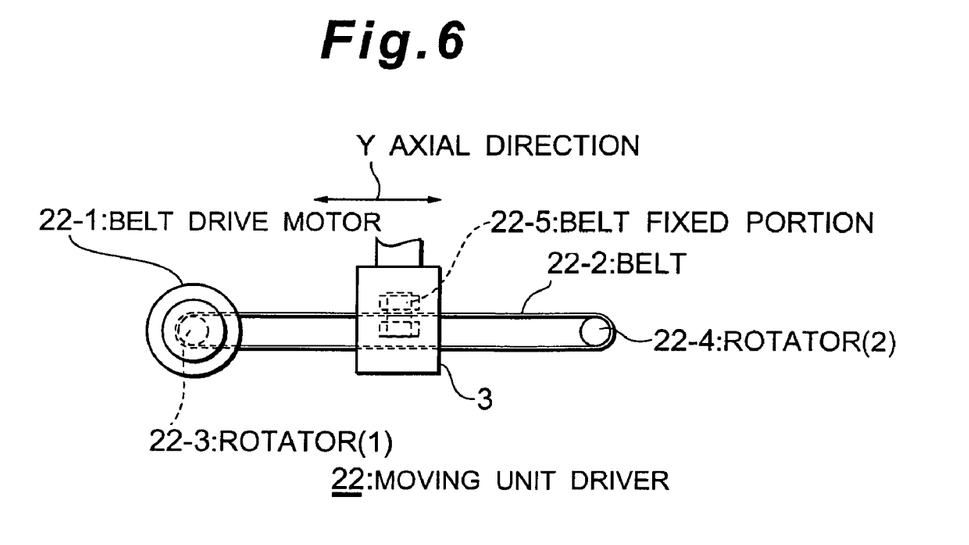
FIG. 6 is a view for explaining a moving unit driver.

FIG. 6 is a view for explaining the moving unit driver.

As shown in the figure, the moving unit driver 22 comprises a belt drive motor 22-1, a belt 22-2, a rotator (1) 22-3, a rotator (2) 22-4, and a belt fixed portion 22-5.

The belt drive motor 22-1 is a motor for rotating the rotator (1) 22-3 rotatably supported by a shaft on the support plate 26 in the forward and reverse directions.

The belt 22-2 is rotatably mounted with the rotator (1) 22-3 and the rotator (2) 22-4 rotatably supported by a shaft on the support plate 26 as two rotation axes. The moving unit 3 is fixed via the belt fixed portion 22-5 at a predetermined position on this belt.

By the belt drive motor 22-1 rotating in the forward and reverse directions under the control of the controller 25 (FIG. 4), the moving unit 3 is capable of arbitrarily moving in the Y axial direction. The movement of the moving unit 3 in the Y axial direction is guided by a slider (1) 29-1 supported by the guide shaft support (1) 28-1 (FIG. 4) and guide shaft support (2) 28-2 on the support plate 26 and by a slider (2) 29-2 supported by the guide shaft support (3) 28-3 and guide shaft support (4) 28-4 on the support plate 26.

A description of the movement of the moving unit 3 in the Z axial direction is omitted because of being completely the same as in specific example 1.

OPERATION OF SPECIFIC EXAMPLE 2

Figures 7A, 7D:
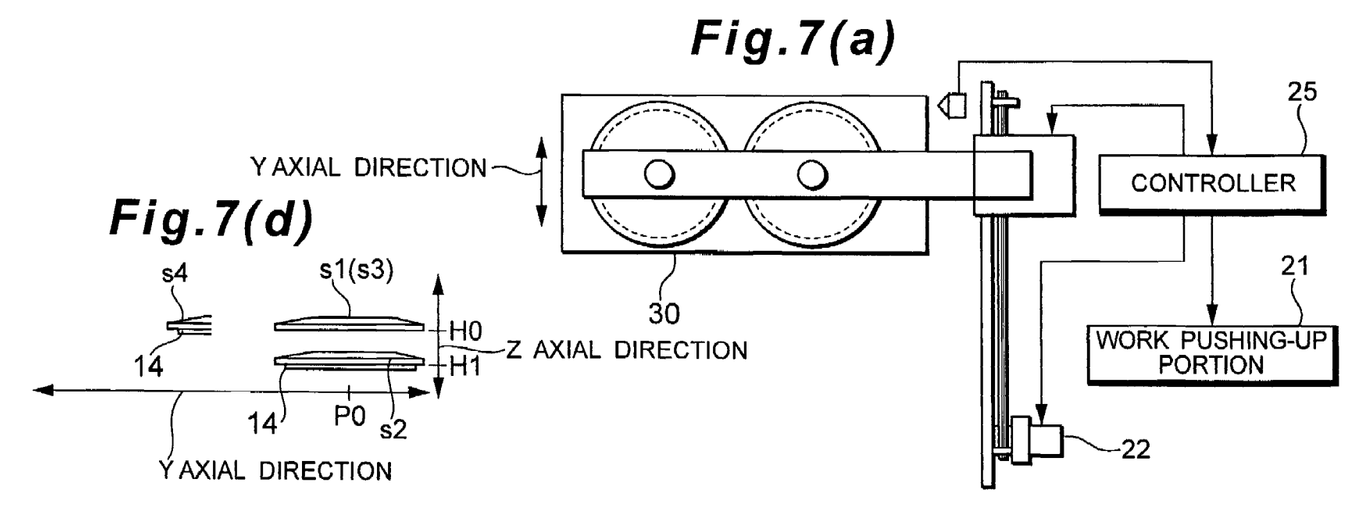
FIG. 7 is a view for explaining the operation of specific example 2.
Figure 7B:
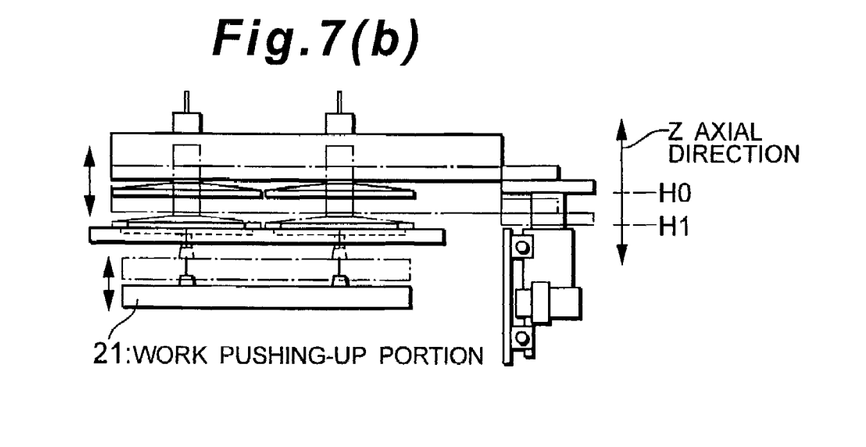
Figure 7C:
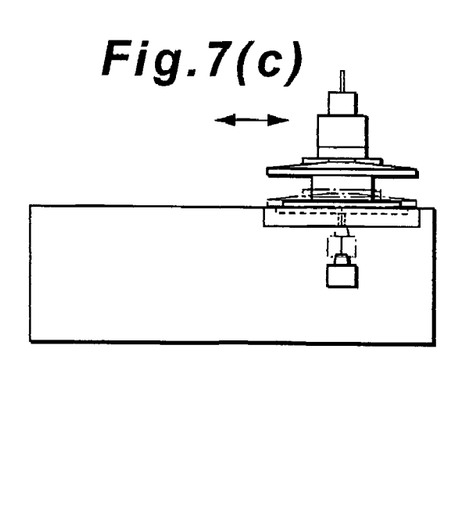

FIG. 7 is a view for explaining the operation of specific example 2.

(a) is a plan view, (b) is a front view, (c) is a left side view, and (d) is a left side imaginary view representing the position change of only the Bernoulli plates.

The operation of specific example 2 is divided into four steps, and these steps will be explained below.

<Step s1>

The controller 25 waits for the arrival of wafers 14 being transported from the preceding process, having the Bernoulli chuck consisting of the Bernoulli plate 1 and the Bernoulli arm 2 stand by at a predetermined position.

Here, the predetermined position is designated by P0 on the Y-axis and H0 on the Z-axis, and the Bernoulli plate 1 is indicated by s1 in FIG. 7d.

<Step s2>

The work detector 4 detects wafers 14 on a tray 30 approaching a predetermined attraction position (P0 on the Y-axis) and notifies the controller 25. That is the detector 4 first detects the wafers 14 on the tray 30 (before they reach the predetermined attraction position P0) at a detection position. The detection position is ahead of the predetermined attraction position P0. The controller 25 controls the air cylinder 3-1 of the moving unit 3 (FIG. 5) to lower the Bernoulli arm 2 together with the Bernoulli plates 1 and has the Bernoulli plates 1 arrive at a position whose Z coordinate is at H1 at the time when the wafers 14 arrive at their predetermined position (P0 on the Y-axis). At this time, the controller 25 introduces nitrogen gas from the gas introducing portions 11 and starts attracting the wafers 14, and simultaneously drives the work pushing-up portion 21 to push up the wafers 14 on the center in an attraction direction (the Z axial direction) to separate the wafers 14 from the tray 30. The Bernoulli plates 1 are indicated by s2 in FIG. 7d.

<Step s3>

Immediately after the work pushing-up portion 21 pushes up, the controller 25 starts returning the Bernoulli plates 1 to the initial position in order to avoid preventing the movement of the tray 30. After starting to hold the wafers by attraction, the controller 25 controls the air cylinder 3-1 of the moving unit 3 (FIG. 5) to raise the Bernoulli arm 2 together with the Bernoulli plates 1 to H0 in the Z axial direction. The Bernoulli plates 1 are indicated by s3 in FIG. 7d.

<Step s4>

When the Bernoulli plates 1 with the wafers 14 attracted thereon return to H0 in the Z axial direction, the controller 25 completes the operation of attracting and receiving the wafers from the preceding process, and starts performing the operation for its own process. The Bernoulli plates 1 are indicated by s4 in FIG. 7d.

Although the above description has been made taking as an example the case where works being handled by the work attracting apparatus are (semiconductor) wafers, the present invention, not being limited to this example, can be applied to, for example, glass plates in a liquid crystal manufacturing process and the like.

Furthermore, although in the above the case has been described where the Bernoulli arm 2 is movable only in the Y and Z axial directions, the present invention, not being limited to this example, can be applied to, for example, the case where the Bernoulli arm 2 also performs predetermined rotation.

Note that, for the present specific example, the work attraction section in the claims refers to a mechanism including the Bernoulli plate 1, the Bernoulli arm 2, and the moving unit 3 and that, for the present specific example, the movement section in the claims refers to a mechanism including the moving unit 3 and the moving unit driver 22.

EFFECT OF SPECIFIC EXAMPLE 2

As described above, in the present specific example, the work pushing-up portion, which applies pressure to predetermined positions of works to displace the works by a predetermined amount in the attraction direction, is provided, and thereby the works can be separated from the tray in attracting the works, thus ensuring the perfect operation of attracting and receiving.

As described above, in the present invention, the apparatus has the work attraction section stand by at a predetermined position, waiting for the arrival of works being transported from the preceding process. When the work detector detects the works having arrived at a predetermined position, the work attraction section moves in the direction in which the works are being transported and at the same speed as the work transport speed for a predetermined time. By this means, the time for the work attraction section to attract the works can be allowed to be long. Thus, even when the Bernoulli chuck or the like having the problem in attracting and receiving is adopted in the work attraction section, the effect can be obtained that the perfect operation of attracting and receiving can be ensured.

Moreover, in a model that cannot, or hardly, adopt the above technology, the work pushing-up portion, which applies pressure to predetermined parts of works to displace the works by a predetermined amount in the attraction direction, is provided, and thereby the works can be separated from the tray in attracting the works. Thus, the effect of ensuring the perfect attracting operation can be obtained.

Although the preferred embodiments of the present invention have been described in detail, it should be understood that various changes, substitutions and alterations can be made therein without departing from the spirit and scope of the invention as defined by the appended claims.

What is claimed is:

1. A work attracting apparatus for attracting work being transported in a transportation direction at a transportation speed; the apparatus comprising:
   a work attraction section for attracting the work being transported;
   a movement section that moves said work attraction section along a transportation direction of said work;
   a work detector that detects said work being transported to a predetermined position along the transportation direction and thereupon outputs a detection signal; and
   a controller operatively connected to said work attraction section, said movement section, and said work detector;
   wherein, upon said controller receiving said detection signal, said controller controls said movement section to move said work attraction section along the transportation direction at the transportation speed, so as to move together with said work being transported from the predetermined position, and
   said controller makes said work attraction section hold the work while being moved along the transportation direction, from the predetermined position.

2. The work attracting apparatus according claim 1, wherein said work attraction section comprises a Bernoulli chuck.

3. A work attracting apparatus for attracting work being transported in a transportation direction at a transportation speed; the apparatus comprising:
   a work attraction section for attracting the work being transported;
   a work detector that detects said work being transported toward a predetermined attraction position and outputs a detection signal when the work reaches a detection position ahead of the predetermined attraction position;
   a work pushing-up portion that applies pressure to a predetermined part of said work to displace said work in a predetermined amount in an attraction direction; and
   a controller operatively connected to said work attraction section, said work detector, and said work pushing-up portion;
   wherein, upon said controller receiving said detection signal, said controller makes said work pushing-up portion operate to displace said work in the predetermined amount in the attraction direction and pushes the work up simultaneously with said work coming to the attraction position.

4. The work attracting apparatus according to claim 3, wherein said work attraction section comprises a Bernoulli chuck.

5. A work attraction method, for attracting work being transported in a transportation direction at a transportation speed; the method comprising:
   making a work attraction section stand by at a predetermined position for attracting the work being transported;
   detecting said work being transported to said predetermined position;
   moving said work attraction section at a same speed as the transportation speed of said work along the transportation direction of said work for a predetermined time; and
   making said work attraction section attract said work during said predetermined time.

6. The work attraction method according to claim 5, wherein said work attraction section attracts said work by using negative pressure based on the Bernoulli principle.

7. A work attraction method, for attracting work being transported in a transportation direction at a transportation speed; the method comprising:
   providing a work attraction section to stand by at a predetermined attraction position for attracting the work being transported;
   detecting said work being transported toward said predetermined attraction position, when said work reaches a detection position ahead of said predetermined attraction position;
   pushing the work and displacing said work in an attraction direction, in a predetermined amount, simultaneously with said work coming to the attraction position.

8. The work attraction method according to claim 7, wherein said work attraction section attracts said work by using negative pressure based on the Bernoulli principle.

9. The work attracting apparatus according claim 1, wherein said controller moves said work attraction section, in a direction generally perpendicular to the transportation direction, toward the work such that said work attraction section begins to hold the work from the predetermined position along the transportation direction.

10. The work attracting apparatus according claim 3, wherein the attraction direction is generally perpendicular to the transportation direction.

11. The work attraction method according to claim 7, wherein the transportation direction is generally perpendicular to the attraction direction.

* * * * *